(12) United States Patent
Lee

(10) Patent No.: US 10,381,419 B2
(45) Date of Patent: Aug. 13, 2019

(54) ORGANIC LIGHT EMITTING DISPLAY DEVICE

(71) Applicant: LG Display Co., Ltd., Seoul (KR)

(72) Inventor: SangKyu Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 40 days.

(21) Appl. No.: 15/166,471

(22) Filed: May 27, 2016

(65) Prior Publication Data

US 2016/0351631 A1  Dec. 1, 2016

(30) Foreign Application Priority Data

May 29, 2015 (KR) .................. 10-2015-0076227

(51) Int. Cl.
G06F 3/041 (2006.01)
H01L 27/32 (2006.01)
H01L 51/00 (2006.01)
H01L 51/52 (2006.01)

(52) U.S. Cl.
CPC .......... *H01L 27/323* (2013.01); *G06F 3/0412* (2013.01); *H01L 51/0024* (2013.01); *H01L 51/5246* (2013.01); *H01L 51/5253* (2013.01); *H01L 51/5284* (2013.01); *G06F 2203/04102* (2013.01)

(58) Field of Classification Search
CPC ............... H01L 27/323; H01L 51/5284; H01L 51/5246; H01L 51/5253; H01L 51/0024; G06F 3/0412; G06F 2203/04102
See application file for complete search history.

(56) References Cited

U.S. PATENT DOCUMENTS

| 2005/0179368 A1* | 8/2005 | Ryu ..................... H01L 51/5284 313/504 |
| 2010/0265188 A1* | 10/2010 | Chang ................... G06F 3/0412 345/173 |
| 2014/0063368 A1* | 3/2014 | Yamazaki .......... G02F 1/13338 349/12 |
| 2014/0145162 A1* | 5/2014 | Lin ....................... H01L 27/323 257/40 |

(Continued)

FOREIGN PATENT DOCUMENTS

| CN | 102405457 A | 4/2012 |
| CN | 204102098 U | 1/2015 |
| TW | 201421308 A | 6/2014 |

OTHER PUBLICATIONS

Extended European Search Report dated Oct. 14, 2016, issued in the corresponding European Patent Application No. 16170772.4.

(Continued)

*Primary Examiner* — Brent D Castiaux
(74) *Attorney, Agent, or Firm* — Morgan, Lewis & Bockius LLP

(57) ABSTRACT

An organic light emitting display device is provided. The organic light emitting display device includes a first substrate including a black matrix on one surface, an overcoating layer formed of a semi-permeable material and configured to equalize a thickness of an area where the black matrix is present to a thickness of an area where the black matrix is not present, and a touch electrode layer on the overcoating layer; and a second substrate including an organic light emitting element on one surface and bonded to the first substrate to face each other.

10 Claims, 5 Drawing Sheets

(56) References Cited

U.S. PATENT DOCUMENTS

| | | | |
|---|---|---|---|
| 2015/0022732 A1* | 1/2015 | Park | G06F 3/044 |
| | | | 349/12 |
| 2015/0048346 A1* | 2/2015 | Lee | H01L 27/323 |
| | | | 257/40 |
| 2015/0263299 A1* | 9/2015 | Liu | C09K 11/06 |
| | | | 257/40 |
| 2015/0362948 A1* | 12/2015 | Wada | G06F 3/0412 |
| | | | 345/173 |

OTHER PUBLICATIONS

Chinese Office Action dated Jul. 9, 2018, issued in Chinese Patent Application No. 201610326225.5.

\* cited by examiner

ORGANIC LIGHT EMITTING DISPLAY DEVICE

CROSS-REFERENCE TO RELATED APPLICATIONS

This application claims the priority of Korean Patent Application No. 10-2015-0076227 filed on May 29, 2015, in the Korean Intellectual Property Office, the disclosure of which is incorporated herein by reference.

BACKGROUND

Field

The present disclosure relates to an organic light emitting display device and a structure thereof, and more particularly, to an organic light emitting display device which is thin enough to be foldable and to a structure thereof.

Description of the Related Art

Various types of display devices are being used in electronic products such as TVs, mobile phones, tablet PCs, notebook computers, etc. Examples of the display devices may include a liquid crystal display (LCD) device, an organic light emitting display (OLED) device, a plasma display panel (PDP) device, a quantum dot display device, a field emission display (FED) device, and an electrophoretic display (EPD) device. In recent years, the OLED device has attracted a lot of attention. The OLED device includes an organic light emitting diode which is a self-emitting element using a thin emission layer. Thus, the OLED device can be manufactured to be thin like paper. The organic light emitting diode includes an anode connected to a thin film transistor, an emission layer, and a cathode. Further, upon application of a voltage to the anode and the cathode, holes and electrons are recombined into excitons within the emission layer. As a result, the excitons transition to a ground state, to thus cause light to be emitted.

As a method for inputting a control signal or user inputs to an electronic device equipped with a display device, a method using a touch panel is being widely used. The touch panel is a device configured to detect a user's touch input such as a screen touch or a user's gesture with respect to a display device. The touch panel is being widely used in portable devices such as smart phones and tablet PCs. Also, it is used in a large-sized display device such as a display device in public facilities and smart TVs.

A touch panel may be installed in a display device as an add-on type, anon-cell type, or an integrated type or in-cell type. In the case of an add-on type touch panel, a display device and a touch panel including a touch sensor are separately manufactured and then, the touch panel is bonded to an upper plate of the display device. In the case of an on-cell type touch panel, a touch sensor is directly manufactured on the upper glass substrate surface of the display device. In the case of an integrated type or in-cell type touch panel, a touch sensor (or touch panel) is built in a display device, and, thus, it is possible to achieve slimming of the display device and also possible to improve the durability of the display device.

In a general display device, a touch screen is implemented by bonding a touch screen panel onto an upper substrate. In this display device, the touch screen panel is separately manufactured and then bonded to an outer surface of the display device. Therefore, the overall thickness of the display device is increased. Further, the increased thickness may cause deterioration in visibility of an image.

In order to solve the above-described problem, recently, an in-cell type touch panel manufactured by integrating a touch panel with a display panel has attracted a lot of attention.

SUMMARY

Accordingly, the present invention is directed to an organic light emitting display device that substantially obviates one or more of the problems due to limitations and disadvantages of the related art.

An object of the present disclosure is to provide an organic light emitting display device.

Another object of the present disclosure is to provide an organic light emitting display device which is improved in transmissivity and thus improved in luminous efficiency.

Another object of the present disclosure is to provide a thin display device which is foldable.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display device may comprises a first substrate including a black matrix disposed on one surface, an overcoating layer formed of a semipermeable material and configured to equalize a thickness of an area where the black matrix is present to a thickness of an area where the black matrix is not present, and a touch electrode layer disposed on the overcoating layer; and a second substrate including an organic light emitting element on one surface and bonded to the first substrate as facing each other.

In another aspect, a touch panel may comprises a flexible film; a black matrix disposed on a surface of the flexible film so as to correspond to a bank between sub-pixels; an overcoating layer configured to planarize the surface of the flexible film by covering an area where the black matrix is present and an area where the black matrix is not present in the surface of the flexible film; and a touch electrode and a line disposed on the overcoating layer.

In another aspect, a display device comprises a first plastic substrate in which a black matrix, a semipermeable overcoating layer, and a touch sensor are integrated; and a second plastic substrate in which pixels each including an organic emission layer are disposed. A bonding structure of the first plastic substrate and the second plastic substrate does not include a polarizer and is foldable.

According to exemplary embodiments of the present disclosure, a display device is improved in transmissivity as compared with a display device using a circular polarizer. Thus, the luminous efficiency of the display device can be improved. Therefore, the display device according to the exemplary embodiments of the present disclosure consumes less power.

Meanwhile, according to the exemplary embodiments of the present disclosure, the number of films used in the organic light emitting display device is reduced. Thus, a thickness of the display device is reduced. Therefore, it is possible to implement a thin display device which is foldable. Further, according to the exemplary embodiments of the present disclosure, the number of films used in the organic light emitting display device is reduced. Thus, manufacturing costs of the display device are reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
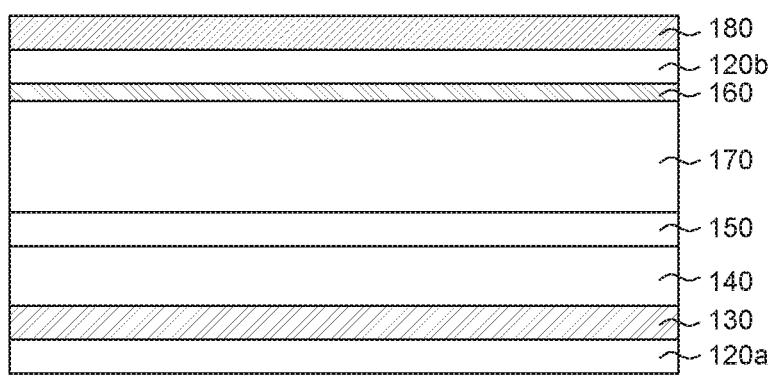
FIG. 1 is a cross-sectional view of an organic light emitting display device according to an exemplary embodiment of the present disclosure.

In describing components of the present disclosure, terms such as first, second, A, B, (a), (b), etc. can be used. These terms are used only to differentiate the components from other components. Therefore, the nature, order, sequence, or the number of the corresponding components is not limited by these terms. It is to be understood that when one element is referred to as being "connected to" or "coupled to" another element, it may be directly connected or coupled to another element or be connected or coupled to another element, having still another element "connected" or "coupled" therebetween. When an element or layer is referred to as being "on" another element or layer, it may be directly on the other element or layer, or intervening elements or layers may be present. Since size and thickness of each component illustrated in the drawings are represented for convenience in explanation, the present disclosure is not limited to the illustrated size and thickness of each component.

The term "organic light emitting display device" which may also be referred to as "display device" herein is used as a general term for organic light emitting diode panels and display devices employing the organic light emitting diode panels. Generally, organic light emitting display devices may be classified into two different types: white organic light emitting display devices; and RGB organic light emitting display devices. In a white organic light emitting display device, each of sub-pixels in a pixel is configured to emit a white light and a set of color filters is used to filter a white light such that the corresponding sub-pixel generates a red light, a green light, and a blue light. Further, the white organic light emitting display device may include a sub-pixel without a color filter to forma sub-pixel for generating a white light. In an RGB organic light emitting display device, an organic emission layer in each sub-pixel is configured to emit a light of a predetermined color. For example, a pixel includes a red sub-pixel including an organic emission layer configured to emit a red light, a green sub-pixel including an organic emission layer configured to emit a green light, and a blue sub-pixel including an organic emission layer configured to emit a blue light.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

FIG. 1 is a cross-sectional view of an organic light emitting display device according to an exemplary embodiment of the present disclosure.

An organic light emitting display (OLED) device according to an exemplary embodiment of the present disclosure may be an in-cell type touch sensor integrated display device. The OLED device may include an upper substrate (e.g. encapsulation plate) 120b including a touch layer 160 and a lower substrate (e.g. array substrate) 120a including an organic light emitting element layer 140. The lower substrate 120a and the upper substrate 120b are bonded by an adhesive layer 170.

The lower substrate 120a and the upper substrate 120b are formed of insulation materials and configured to support or accommodate various components of the OLED device. The lower substrate 120a and the upper substrate 120b may be formed of materials having flexibility. For example, the lower substrate 120a and the upper substrate 120b may be plastic films formed of one or more organic materials selected from polyethylene naphthalate (PEN), ployethylene terephthalate (PET), polyethylene ether phthalate, poly carbonate, poly arylate, polyether imide, polyether sulfonate, polyimide, and polyacrylate.

If the lower substrate 120a is formed of a material having flexibility, a back plate (or similar element) configured to support the lower substrate 120a may be used.

A buffer layer 130 (or element of similar function) is provided between the lower substrate 120a and the organic light emitting element layer 140. The buffer layer 130 is configured to improve adhesion between the organic light emitting element layer 140 and the lower substrate 120a. Further, the buffer layer 130 is configured to suppress diffusion of moisture or impurities from the lower substrate 120a into the organic light emitting element layer 140. The buffer layer 130 may be formed into a single layer of an inorganic insulation material such as silicon oxide ($SiO_2$) or silicon nitride (SiNx), or may be formed into a double-layered structure of silicon oxide ($SiO_2$) and silicon nitride (SiNx).

The organic light emitting element layer 140 is formed on the lower substrate 120a with the buffer layer 130 interposed therebetween. In the organic light emitting element layer 140, a thin film transistor, an organic light emitting diode, and the like are disposed.

A protection (or passivation) film 150 is formed on the organic light emitting element layer 140. The protection film 150 may be formed as a single layer of an inorganic insulation material such as aluminum oxide (AlOx), silicon oxynitride (SiON), silicon nitride (SiNx), or silicon oxide (SiOx), or an organic insulation material such as benzocyclobutene or photo acryl. Otherwise, the protection film 150 may be formed as a structure in which an inorganic insulation material and an organic insulation material are alternately laminated into two or more total layers.

Meanwhile, a drive IC (or other elements with similar functions) can be placed on one lateral surface of the lower substrate 120a. The drive IC can be connected to a printed circuit board (PCB). The PCB can include a timing controller (or other means) that supplies various control signals for driving the organic light emitting element and a power supply unit that supplies a driving voltage. The signals from the PCB are applied to the organic light emitting element layer 140 through the drive IC. Particularly, in the PCB, a flexible printed circuit board (FPCB) including a touch controller for driving the touch layer 160 may be integrated. The FPCB is electrically connected to the touch layer 160 through anisotropic conductive paste (ACP) or an anisotropic conductive film (ACF).

The touch layer 160 formed on the upper substrate (encapsulation plate) 120b is bonded onto the protection film 150 so as to face each other through the adhesive layer 170.

The adhesive layer 170 is formed on the touch layer 160. Further, the adhesive layer 170 is bonded onto the protection (or passivation) film 150, and, thus, the upper substrate 120b and the lower substrate 120a are bonded so as to face each other.

The touch layer 160 may be electrically connected to the organic light emitting element layer 140 through anisotropic conductive paste (ACP). The ACP may have a structure in which conductive balls coated with metal such as gold (Au), silver (Ag), copper (Cu), and molybdenum (Mo) are dispersed in a sealant.

The ACP connects a pad of the touch layer 160 to the FPCB. Further, the pad is connected to routing lines of an X-electrode 161a and a Y-electrode 161b of the touch layer 160.

Generally, the FPCB for driving the touch layer 160 is formed separately from the PCB for driving the organic light emitting element layer 140. However, in the present disclosure, the FPCB for driving the touch layer 160 can be integrated with the PCB for driving the organic light emitting element layer 140. Further, the FPCB and the touch layer 160 may be connected to each other using the ACP.

Therefore, in the in-cell type touch sensor integrated OLED device according to the present disclosure, the FPCB for driving the touch layer 160 is integrated with the PCB for driving the organic light emitting element layer 140, thereby reducing manufacturing costs.

Further, a top cover 180 may be bonded to one surface of the upper substrate 120b on which the touch layer 160 is formed. The top cover 180 may be formed of a particular material, such as polymethly methacrylate (PMMA), polyurethane (PU), acryl, a cyclo olefin polymer (COP), ployethylene terephthalate (PET), polyethylene naphthalate (PEN), or polyimide, having flexibility and a high transmissivity.

Further, a bottom cover formed of a material such as polymethly methacrylate (PMMA), polyurethane (PU), acryl, a cyclo olefin polymer (COP), ployethylene terephthalate (PET), polyethylene naphthalate (PEN), or polyimide may be disposed on a rear surface of the lower substrate 120a.

According to the present disclosure, the organic light emitting element layer 140 and the touch layer 160 are formed on the lower substrate 120a and the upper substrate 120b, respectively. Thus, the in-cell type touch sensor integrated OLED device has flexibility. Particularly, a flexible substrate has a smaller thickness than a general rigid substrate. Therefore, a display device can be manufactured to be thin.

Further, the FPCB including the touch controller for driving the touch layer 160 is formed on the PCB for driving the organic light emitting element layer 140 and the FPCB is electrically connected to the touch layer 160 through the ACP. Thus, the FPCB for driving the touch layer 160 can be integrated with the PCB for driving the organic light emitting element layer 140, and manufacturing costs can be reduced.

Figure 2A:
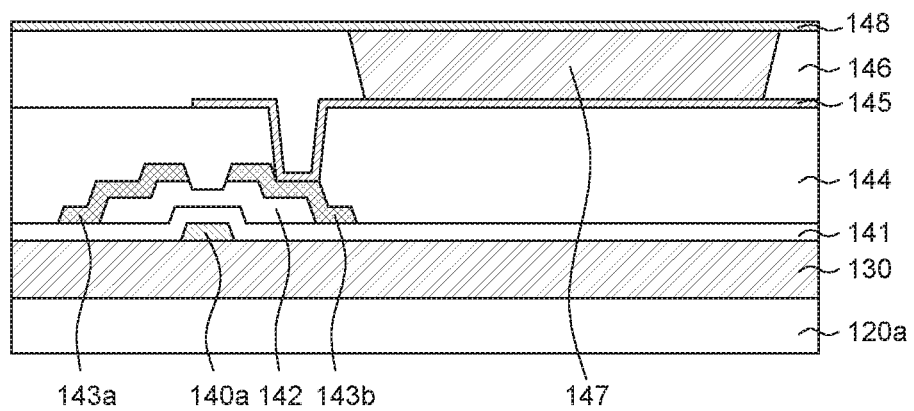
FIG. 2A is a cross-sectional view of an organic light emitting element layer according to an exemplary embodiment of the present disclosure and FIG. 2B is a cross-sectional view of a touch layer according to an exemplary embodiment of the present disclosure.
Figure 2B:
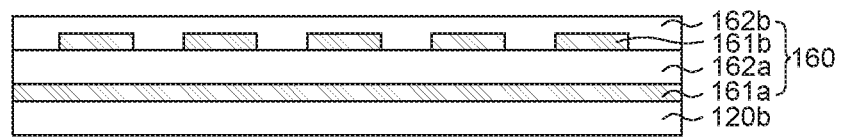

FIG. 2A is a cross-sectional view of an organic light emitting element layer according to an exemplary embodiment of the present disclosure and FIG. 2B is a cross-sectional view of a touch layer according to an exemplary embodiment of the present disclosure.

Referring to FIG. 2A, the buffer layer 130 is provided between the lower substrate 120a and the organic light emitting element layer 140. The buffer layer 130 is configured to improve adhesion between the organic light emitting element layer 140 and the lower substrate 120a. Further, the buffer layer 130 is configured to suppress diffusion of moisture or impurities from the lower substrate 120a into the organic light emitting element layer 140. The buffer layer 130 may be formed as a single layer of an inorganic insulation material such as silicon oxide ($SiO_2$) or silicon nitride (SiNx), or may be formed into a double or multi-layered structure of silicon oxide ($SiO_2$) and silicon nitride (SiNx).

The organic light emitting element layer 140 is formed on the lower substrate 120a with the buffer layer 130 interposed therebetween. As illustrated in FIG. 2A, the organic light emitting element layer 140 includes a thin film transistor including a gate electrode 140a, a gate insulation film 141, a semiconductor layer 142, a source electrode 143a, and a drain electrode 143b; and an organic light emitting element including a first electrode 145, an organic emission layer 147, and a second electrode 148.

Specifically, the gate electrode 140a is formed on the buffer layer 130, and the gate insulation film 141 is formed so as to cover the gate electrode 140a. The semiconductor layer 142 is formed on the gate insulation film 141 so as to be overlapped with the gate electrode 140a. The source electrode 143a and the drain electrode 143b are formed as being spaced from each other on the semiconductor layer 142.

A planarization film. 144 may be formed of acryl-based resin so as to cover the thin film transistor. The planarization film 144 is configured to planarize (or flatten) the lower substrate 120a on which the thin film transistor is formed. An inorganic film may be formed of silicon oxide (SiOx) or silicon nitride (SiNx) between the gate insulation film 141 and the planarization film 144. Thus, it is possible to improve interfacial stability of the planarization film 144 with respect to each of the gate insulation film 141 and the source and drain electrodes 143a and 143b.

Further, the first electrode 145 connected to the drain electrode 143b, a bank insulation film 146 through which a partial area of the first electrode 145 is exposed, the organic emission layer 147 formed on the exposed first electrode 145, and the second electrode 148 on the organic emission layer 147 are formed on the planarization film 144. The bank insulation film 146 is configured to define an emission area of the organic light emitting element layer and suppress a light leakage from a non-emission area.

Referring to FIG. 2B, the touch layer 160 formed on the upper substrate 120b is bonded onto the protection film 150 as facing each other through the adhesive layer 170.

As shown in FIG. 2B, the touch layer 160 formed on the upper substrate 120b includes a plurality of X-electrodes 161a and Y-electrodes 161b intersecting each other with a first insulation film 162a interposed therebetween, and a second insulation film 162b formed to cover the Y-electrodes 161b.

The X-electrode 161a and the Y-electrode 161b of the touch layer 160 are connected to a pad (or connection terminal) through routing lines. Herein, the pad may be a voltage application pad or a voltage detection pad. The above-described touch layer 160 may be driven as a mutual capacitive type. In the mutual capacitive type, a driving voltage is applied to the X-electrodes 161a and the Y-electrodes 161b sense any voltage drop change depending on the presence or absence of a touch contact made thereto. In some cases, the touch layer 160 may include a bridge electrode formed on the upper substrate 120b, a first insulation film formed to cover the bridge electrode, an X-electrode formed on the first insulation film and electrically connected through the bridge electrode, a Y-electrode formed on the same layer as the X-electrode, and a second insulation film formed to cover the Y-electrode.

Figure 3:
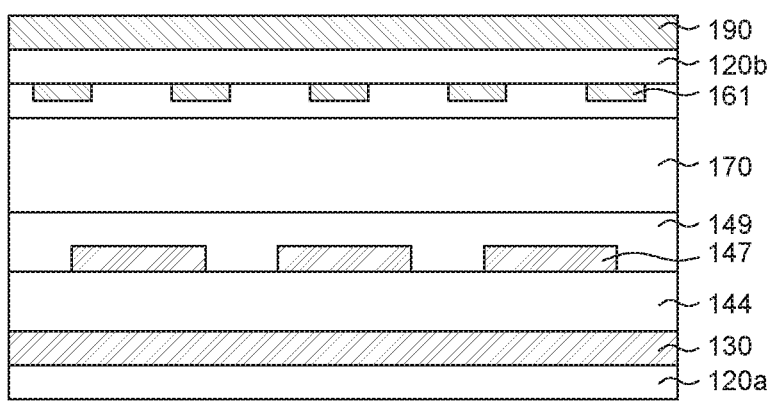
FIG. 3 is a cross-sectional view of an in-cell type touch sensor integrated organic light emitting display device according to an exemplary embodiment of the present disclosure.

FIG. 3 is a cross-sectional view of an in-cell type touch sensor integrated OLED device according to an exemplary embodiment of the present disclosure.

The OLED device may include the same components as described above with reference to FIG. 1 and FIG. 2. That is, the lower substrate 120a, the organic emission layer 147, the upper substrate 120b, and the touch electrode 161 are substantially the same as those described above with reference to FIG. 1 and FIG. 2.

An encapsulation layer 149 is positioned on the organic emission layer 147. Herein, the encapsulation layer 149 may be formed into an inorganic film of glass, metal, aluminum oxide (AlOx), or a silicon (Si)-based material, or may be formed into a structure in which an organic film and an inorganic film are alternately laminated. The encapsulation layer 149 is configured to block infiltration of oxygen and moisture in order to suppress oxidation of a light emitting material and/or an electrode material. If the organic light emitting element is exposed to moisture or oxygen, pixel shrinkage that reduces the emission area may occur or dark spots may be generated within the emission area.

The adhesive layer 170 may be positioned on the encapsulation layer 149. The adhesive layer 170 may be a thermally curable or naturally curable adhesive. For example, the adhesive layer 170 may be formed of a material such as barrier pressure sensitive adhesive (B-PSA).

A barrier film (or similar layer) may be positioned on the adhesive layer 170. The barrier film is configured to encapsulate the entire substrate including the organic light emitting element. The barrier film may be a retardation film or an optically isotropic film. If the barrier film has an optically isotropic property, the barrier film transmits light incident into the barrier film without the retardation. Further, an organic film and/or an inorganic film may be further provided on an upper and/or lower surface of the barrier film. Herein, the inorganic film may include a silicon oxide (SiOx) film or a silicon nitride (SiOx) film. The organic film may include a polymer such as acryl-based resin, epoxy-based resin, polyimide or polyethylene. The organic film or inorganic film formed on the upper or lower surface of the barrier film functions to block infiltration of moisture or oxygen from the outside. The barrier film may be laminated by a roller lamination method or a vacuum lamination method.

The OLED device may further include a polarizing film 190 positioned on an upper surface of the upper substrate 120b. The polarizing film 190 is used to remove reflections of external incident light and thus improves visibility of the display device. For example, the polarizing film 190 may include a linear polarizer and a λ/4 retardation film. In this case, external incident light is in a circularly polarized state while passing through the linear polarizer and the λ/4 retardation film. Further, light emitted from the display panel has a polarizer axis orthogonal to a polarizer axis of the external incident light so as to offset each other. Therefore, the external light is shielded, and visibility of the display device is improved. Meanwhile, the polarizing film 190 may be formed as a circular polarizer.

The OLED device illustrated in FIG. 3 may include the polarizing film 190, the barrier film, and the film-shaped touch layer laminated by a lamination process. If three kinds of films are used as such, the sum of the thicknesses of the films may be 200 μm or more. Further, it is difficult to reduce a thickness of each of the films. Therefore, it may be difficult to apply a structure as illustrated in FIG. 3 to a foldable display device. This is because as the thickness of a display device is increased, a stress applied to the display device when being folded is increased. Therefore, in order to implement a foldable display device, a thin structure is needed. Further, the structure as illustrated in FIG. 3 needs to be modified to be thinner.

Besides, the transmissivity of the circular polarizer is 45% or less and thus becomes one of the causes of reducing the efficiency of the OLED device. Therefore, the transmissivity of the circular polarizer also needs to be improved.

Figure 4:
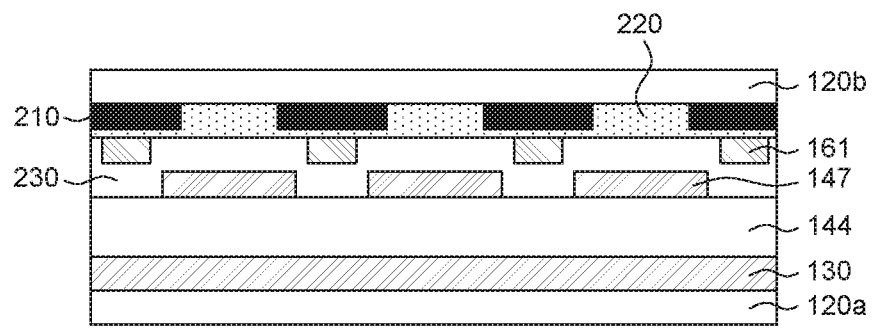
FIG. 4 is a cross-sectional view of an in-cell type touch sensor integrated organic light emitting display device according to another exemplary embodiment of the present disclosure.

FIG. 4 is a cross-sectional view of an in-cell type touch sensor integrated OLED device according to another exemplary embodiment of the present disclosure.

The in-cell type touch sensor integrated OLED device employs an overcoating layer formed of a semi-permeable material instead of the circular polarizer. Specifically, referring to FIG. 4, the OLED device includes a black matrix 210 positioned on one surface of an upper substrate (touch panel), an overcoating layer 220 formed on an area where the black matrix is present and an area where the black matrix is not present, and a touch electrode 161 disposed on the overcoating layer.

The upper substrate (first substrate) is formed of an insulation material, and may be formed of a material having flexibility. For example, the first substrate 120b may be a plastic film formed of one or more organic materials selected from polyethylene naphthalate (PEN), ployethylene terephthalate (PET), polyethylene ether phthalate, poly carbonate, poly arylate, polyether imide, polyether sulfonate, polyimide, and polyacrylate. The first substrate 120b may be a high heat-resistance transparent plastic film having a transmissivity of 85% or more.

The black matrix 210 is positioned corresponding to a boundary of each pixel region and configured to suppress a leakage of a light emitted from a specific pixel to its adjacent pixel region. That is, the black matrix 210 prevents color mixing at the boundary of each pixel region. The black matrix 210 may be formed of chromium (Cr) or other opaque metals, or may be formed of resin. The black matrix 210 may be positioned to face a bank on the organic light emitting element layer. Herein, the black matrix 210 may be formed to have a smaller width than the bank. The bank is a structure configured to separate sub-pixels.

The overcoating layer 220 is configured to planarize an upper part of the substrate 120b and the black matrix 210. The overcoating layer 220 is formed of a material (semi-permeable material) capable of reducing the transmissivity of a visible light at a certain ratio. The overcoating layer 220 is formed to have a higher transmissivity than the circular polarizer. For example, if the overcoating layer 220 has a transmissivity in the range of 45% to 80%, the luminous efficiency of the OLED device can be improved. The overcoating layer 220 may be formed to have transmissivity in the range of 60% to 70% according to characteristics of the display device. The overcoating layer 220 may be formed to have a uniform transmissivity in the entire visible light wavelength range. Otherwise, the overcoating layer 220 may be formed to have different transmissivities for respective wavelength ranges.

The overcoating layer 220 may be formed of a material in which an organic dye is homogeneously dissolved in a polymer such as acryl or polyimide (PI). The polymer may have a heat-resistance of 250° C. or more.

The organic dye may include one or more materials selected from black dye, Amidoschwarz, sodium 1-[1-hydroxynaphthylazo]-6-nitro-2-naphthol-4-sulfonate, and triisocyanato-(2,2';6',6"-terpyridyl-4,4',4"-tricarboxylato) ruthenium (II) tris(tetra-butylammonium). The black dye has a structure in which only one monoprotonated hydrogen atom of a polypyridyl ligand (tcterpy: 4,4',4"-tricarboxy-2,2':6',2"-terpyridine) can be adsorbed to a metal oxide. The black dye can be prepared by reducing hydrogen bonding between molecules so as to reduce aggregation of the dye on a surface of the metal oxide. The black dye has a smaller adsorption amount and a lower molar extinction coefficient in an MLCT region but has improved photoelectric conversion efficiency as compared with an N3 dye. Further, the black dye has an excellent red shift light absorption capacity.

The organic dye may be prepared by mixing a red dye, a blue dye, and a green dye at an appropriate ratio so as to uniformly absorb wavelengths in the visible light range. This method is similar to the method of forming the overcoating layer using the black dye except a kind of an organic dye.

An amount of the organic dye may vary depending on the kind of organic dye. This is because each organic dye has a different extinction coefficient and the solubility of a material for preparing the overcoating layer varies depending on a kind of the organic dye. The amount of the organic dye is adjusted such that the overcoating layer has a transmissivity of 45% to 90% in the visible light range and also adjusted such that the organic dye is homogeneously dissolved.

Meanwhile, the overcoating layer 220 may be formed into a structure in which a particle-shaped material such as graphite, carbon nanoparticles, or carbon nanotubes is dispersed in a polymer such as acryl or polyimide (PI). This is because the above-described particles are not dissolved in the polymer. The particle-shaped material such as graphite, carbon nanoparticles, or carbon nanotubes applied to the overcoating layer may be uniformly dispersed. If not, defects such as spots or mura may occur after the panel is manufactured. The particles may maintain a uniform dispersity of 5 or less.

The touch electrode 161 and its relevant lines are disposed on the overcoating layer 220. The touch electrode (driving electrode and/or sensing electrode) 161 may be a transparent electrode formed of ITO or the like. The touch electrode 161 is connected to the pad on the lower substrate through an anisotropic conductive film (ACF) or anisotropic conductive paste (ACP). A touch driver-IC for driving the touch electrode is mounted on a flexible printed circuit board (FPCB) and connected to the pad. The touch driver-IC and another driver-IC may be mounted on a single FPCB.

The first substrate 120b including the black matrix 210, the semi-permeable overcoating layer 220, and the touch electrode 161 is bonded to the second substrate 120a on which the organic light emitting element is disposed. Herein, an adhesive layer 230 configured to bond the first substrate to the second substrate may be used. The adhesive layer 230 is positioned between a touch electrode layer on the first substrate and an organic light emitting element layer (or an encapsulation layer) on the second substrate. The adhesive layer 230 may be formed of an adhesive. The adhesive may be a material capable of adhesion without a change in state. In this case, since there is no change in state, the adhesive is re-usable/re-adhesible. The first substrate 120b and the adhesive layer 230 may function as an encapsulation layer.

The second substrate 120a is formed of an insulation material, and may be formed of a material having flexibility. For example, the second substrate 120a may be a plastic film formed of one or more organic materials selected from polyethylene naphthalate (PEN), ployethylene terephthalate (PET), polyethylene ether phthalate, poly carbonate, poly arylate, polyether imide, polyether sulfonate, polyimide, and polyacrylate.

The first substrate 120b and the second substrate 120a may be manufactured on a supporting substrate (e.g.: glass substrate). After the first substrate 120b and the second substrate 120a are bonded to each other and a circuit board is connected thereto, the supporting substrate can be released or removed.

The display device manufactured by bonding the first substrate 120b and the second substrate 120a is thinner than the display device illustrated in FIG. 3. That is, the OLED device illustrated in FIG. 4 does not include a polarizer and thus can have a thickness (i.e., the sum of the thicknesses of the first substrate, the second substrate, and the adhesive layer) of 100 µm or less. Further, the first substrate 120b and the overcoating layer 220 may be manufactured to have a total thickness of 15 µm or less. Accordingly, the OLED device may be foldable with a curvature of 2.5 R or less. Herein, "R" means a radius of curvature and a unit of "R" represents "millimeter (mm)". The upper substrate 120b of the display device may be directly bonded to an outer cover without a polarizer (polarizing film).

The above-described OLED device is improved in transmissivity and thus improved in luminous efficiency as compared with an OLED device using a circular polarizer, and also consumes less power. Further, according to the exemplary embodiments, the number of films (or layers) used in an OLED device is reduced, and, thus, a thickness of the display device is reduced. Accordingly, it is possible to implement a thin display device which is foldable. Meanwhile, according to the exemplary embodiments, the number of films used in an OLED device is reduced, and, thus, manufacturing costs of the display device are reduced. In addition, if a touch driver-IC and another driver-IC are integrated with an FPCB, price competitiveness of the display device can be enhanced.

The exemplary embodiments of the present disclosure can also be described as follows:

According to an embodiment of the present disclosure, an organic light emitting display device may include: a first substrate including a black matrix on one surface, an overcoating layer formed of a semipermeable material and configured to equalize a thickness of an area where the black matrix is present to a thickness of an area where the black matrix is not present, and a touch electrode layer on the overcoating layer; and a second substrate including an organic light emitting element on one surface and bonded to the first substrate as facing each other.

The organic light emitting display device may further include: an adhesive layer positioned between the touch electrode layer of the first substrate and an organic light emitting element layer of the second substrate and configured to bond the first substrate and the second substrate.

The overcoating layer may be formed of a material having a visible light transmissivity of 45% to 80%.

The overcoating layer may have a uniform transmissivity in the entire visible light wavelength range.

The overcoating layer may be formed of a material in which an organic dye is homogeneously dissolved in a polymer.

The organic dye may be a black dye.

The polymer may have a heat-resistance of 250° C. or more.

The overcoating layer may be formed of a material in which at least one particle-shaped material of graphite, carbon nanoparticles, and carbon nanotubes is dispersed in a polymer.

The first substrate and the second substrate may be films formed of at least one of polyethylene naphtalate, ployethylene terephthalate, polyethylene ether phthalate, poly carbonate, poly arylate, polyether imide, polyether sulfonate, polyimide, and polyacrylate.

The sum of thicknesses of the first substrate, the second substrate, and the adhesive layer may be 100 μm or less and the first substrate, the second substrate, and the adhesive layer are foldable with a radius of curvature of 2.5 mm or less.

According to another embodiment of the present disclosure, a touch panel may include: a flexible film; a black matrix on a surface of the flexible film so as to correspond to a bank between sub-pixels; an overcoating layer configured to planarize the surface of the flexible film by covering an area where the black matrix is present and an area where the black matrix is not present in the surface of the flexible film; and a touch electrode and a line on the overcoating layer.

In the flexible film, a surface opposite to the surface on which the black matrix is disposed may be directly bonded to an outer cover without a polarizing film.

The overcoating layer may be formed of a semipermeable material having a visible light transmissivity of 45% to 80%.

The overcoating layer may be formed of a material in which an organic dye is dissolved in a polymer having a heat-resistance of 250° C. or more.

The sum of thicknesses of the flexible film and the overcoating layer may be 15 μm or less.

According to yet another embodiment of the present disclosure, a display device may include: a first plastic substrate in which a black matrix, a semipermeable overcoating layer, and a touch sensor are integrated; and a second plastic substrate in which pixels each including an organic emission layer are disposed. A bonding structure of the first plastic substrate and the second plastic substrate is foldable and does not include a polarizer.

The overcoating layer may be implemented to have a function to planarize a surface by covering an area where the black matrix is present and an area where the black matrix is not present.

The overcoating layer may be implemented to further have a function of reducing transmissivity of a visible light at an equal ratio.

The bonding structure of the first plastic substrate and the second plastic substrate may have a thickness of 100 μm or less and may be foldable with a radius of curvature of 2.5 mm or less.

The overcoating layer may be a semi-permeable material having a visible light transmissivity of 45% to 80%.

It will be apparent to those skilled in the art that various modifications and variations can be made in the organic light emitting display device of the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
   a first substrate;
   a black matrix including a first surface on one surface of the first substrate;
   an overcoating layer including a semi-permeable material that reduces a transmissivity of visible light at a certain ratio, the overcoating layer shielding external light in place of a separate polarizer, the overcoating layer being configured to equalize a thickness of an area where the black matrix is present to a thickness of an area where the black matrix is not present, the overcoating layer entirely covering a second surface of the black matrix opposite to the first surface of the black matrix;
   a touch electrode layer on and directly contacting the overcoating layer, and spaced apart from the black matrix;
   a second substrate;
   an organic light emitting element on one surface of the second substrate; and
   an adhesive layer between the touch electrode layer and the organic light emitting element layer, the adhesive layer covering and directly contacting all conductive surfaces of the touch electrode layer other than a surface directly contacting the overcoating layer in a cross-sectional view, the adhesive layer being configured to bond the first substrate to the second substrate, such that the first substrate and the second substrate face each other.

2. The organic light emitting display device according to claim 1, wherein the semi-permeable material of the overcoating layer has a visible light transmissivity of 45% to 80%.

3. The organic light emitting display device according to claim 2, wherein the overcoating layer has a uniform transmissivity in the entire visible light wavelength range.

4. The organic light emitting display device according to claim 2, wherein the semi-permeable material of the overcoating layer includes an organic dye homogeneously dissolved in a polymer.

5. The organic light emitting display device according to claim 2, wherein the semi-permeable material of the overcoating layer includes at least one of: particle-shaped graphite, carbon nanoparticles, and carbon nanotubes, dispersed in a polymer.

6. The organic light emitting display device according to claim 2, wherein the first substrate and the second substrate include films including at least one of: polyethylene naphthalate, polyethylene terephthalate, polyethylene ether phthalate, polycarbonate, polyarylate, polyetherimide, polyether sulfonate, polyimide, and polyacrylate.

7. A display device, comprising:
   a first plastic substrate including:

a black matrix (BM);

a semi-permeable overcoating layer, the semi-permeable overcoating layer entirely covering a first surface of the BM opposite to a second surface of the BM in contact with the first plastic substrate; and a touch sensor on the semi-permeable overcoating layer, the touch sensor being spaced apart from the BM, the touch sensor directly contacting the semi-permeable overcoating layer; and a second plastic substrate on which pixels including an organic emission layer are disposed, each pixel including a pixel region;

an adhesive layer bonding the first plastic substrate to the second plastic substrate, the adhesive layer covering and directly contacting all conductive surfaces of the touch sensor other than a surface directly contacting the overcoating layer in a cross-sectional view; and a cover plate attached to the first plastic substrate without a polarizer therebetween, wherein the BM is positioned corresponding to a boundary of each pixel region, wherein a bonding structure of the first plastic substrate and the second plastic substrate permits a foldable configuration, and wherein the bonding structure includes the adhesive layer and the cover plate.

8. The display device according to claim 7, wherein the overcoating layer is configured to reduce transmissivity of a visible light at an equal ratio.

9. The display device according to claim 7, wherein:

the bonding structure of the first plastic substrate and the second plastic substrate has a thickness of 100 μm or less; and the bonding structure of the first plastic substrate and the second plastic substrate permits the foldable configuration with a radius of curvature of 2.5 mm or less.

10. The display device according to claim 7, wherein the overcoating includes a semi-permeable material having a visible light transmissivity of 45% to 80%.

* * * * *